(12) United States Patent
Yoon et al.

(10) Patent No.: US 11,594,766 B2
(45) Date of Patent: Feb. 28, 2023

(54) APPARATUS AND METHOD FOR TESTING SECONDARY BATTERY

(71) Applicant: LG Chem, Ltd., Seoul (KR)

(72) Inventors: Dong-Sik Yoon, Daejeon (KR); Jin-Kyu Lee, Daejeon (KR)

(73) Assignee: LG Energy Solution, Ltd.

( * ) Notice: Subject to any disclaimer, the term of this patent is extended or adjusted under 35 U.S.C. 154(b) by 314 days.

(21) Appl. No.: 16/652,551

(22) PCT Filed: Mar. 26, 2019

(86) PCT No.: PCT/KR2019/003523
§ 371 (c)(1),
(2) Date: Mar. 31, 2020

(87) PCT Pub. No.: WO2019/212148
PCT Pub. Date: Nov. 7, 2019

(65) Prior Publication Data
US 2020/0243920 A1 Jul. 30, 2020

(30) Foreign Application Priority Data

Apr. 30, 2018 (KR) .................. 10-2018-0050119

(51) Int. Cl.
H01M 10/42 (2006.01)
G01R 31/3835 (2019.01)
G01R 31/36 (2020.01)

(52) U.S. Cl.
CPC .... *H01M 10/4285* (2013.01); *G01R 31/3648* (2013.01); *G01R 31/3835* (2019.01)

(58) Field of Classification Search
CPC ........... G01R 31/3835; G01R 31/3648; H01M 10/4285
USPC ......................................................... 702/63
See application file for complete search history.

(56) References Cited

U.S. PATENT DOCUMENTS 4,698,584 A 10/1987 Morin
5,049,803 A * 9/1991 Palanisamy ........ G01R 31/3842
320/147

(Continued)

FOREIGN PATENT DOCUMENTS

JP 2007064871 A 3/2007
JP 2008078256 A 4/2008

(Continued)

OTHER PUBLICATIONS

Extended European Search Report including Written Opinion for Application No. 19796548.6 dated Jan. 13, 2021, 7 pages.

(Continued)

*Primary Examiner* — Ricky Go
(74) *Attorney, Agent, or Firm* — Lerner, David, Littenberg, Krumholz & Mentlik, LLP

(57) ABSTRACT

An apparatus and method for testing a secondary battery. The apparatus includes a test path, test terminals provided at two ends of the test path and electrically connected to a positive terminal and a negative terminal of the secondary battery respectively, a sensor unit provided on the test path and configured to measure a discharge current of the secondary battery, a constant voltage generation unit provided on the test path and configured to maintain a constant voltage between the secondary battery and the sensor unit, and a control unit configured to receive data indicating the discharge current from the sensor unit, measure an inflection point on a profile of the discharge current, measure an intensity of the discharge current on the basis of the inflection point, and test a level of self-discharge of the secondary battery based on the intensity of the discharge current.

12 Claims, 5 Drawing Sheets

(56) References Cited

U.S. PATENT DOCUMENTS

| | | | |
|---|---|---|---|
| 5,623,210 A | 4/1997 | Sakamoto | |
| 7,928,735 B2* | 4/2011 | Huang | B60L 58/15 |
| | | | 324/426 |
| 8,604,755 B2* | 12/2013 | Nishimura | H02J 7/00047 |
| | | | 320/132 |
| 9,608,456 B2* | 3/2017 | Martin | H01M 10/44 |
| 2002/0109506 A1 | 8/2002 | Kawakami et al. | |
| 2003/0210056 A1 | 11/2003 | Arai et al. | |
| 2006/0164042 A1 | 7/2006 | Sim | |
| 2009/0179088 A1* | 7/2009 | Mochizuki | F02D 41/2096 |
| | | | 239/584 |
| 2010/0244847 A1 | 9/2010 | Kudo et al. | |
| 2015/0046110 A1 | 2/2015 | Joe et al. | |
| 2015/0051854 A1 | 2/2015 | Joe et al. | |
| 2015/0226809 A1 | 8/2015 | Joe et al. | |
| 2017/0153290 A1 | 6/2017 | Sazhin et al. | |
| 2017/0336479 A1 | 11/2017 | Busser | |
| 2018/0149701 A1 | 5/2018 | Koo et al. | |

FOREIGN PATENT DOCUMENTS

| | | |
|---|---|---|
| JP | 2010249793 A | 11/2010 |
| JP | 5202698 B2 | 6/2013 |
| JP | 2015185485 A | 10/2015 |
| JP | 2017009422 A | 1/2017 |
| JP | 2017009465 A | 1/2017 |
| KR | 1019870000597 A | 2/1987 |
| KR | 101372157 B1 | 3/2014 |
| KR | 20140071261 A | 6/2014 |
| KR | 101454832 B1 | 10/2014 |
| KR | 20170062765 A | 6/2017 |
| WO | 2014137082 A1 | 9/2014 |

OTHER PUBLICATIONS

International Search Report from Application No. PCT/KR2019/003523, dated Jul. 3, 2019, 2 pages.

Search Report dated Sep. 29, 2022 from Office Action for Chinese Application No. 2019800048020 dated Oct. 10, 2022. 2 pgs.

* cited by examiner

APPARATUS AND METHOD FOR TESTING SECONDARY BATTERY

CROSS-REFERENCE TO RELATED APPLICATIONS

The present application is a national phase entry under 35 U.S.C. § 371 of International Application No. PCT/KR2019/003523 filed Mar. 26, 2019, published in Korean, which claims priority from Korean Patent Application No. 10-2018-0050119 filed Apr. 30, 2018, all of which are incorporated herein by reference.

TECHNICAL FIELD

The present disclosure relates to an apparatus and method for testing a secondary battery, and more particularly, to an apparatus and method for testing a secondary battery that effectively determines a low voltage battery possibility of the secondary battery during self-discharge of the secondary battery.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

The lithium secondary battery mainly uses lithium-based oxide and a carbon material for a positive electrode active material and a negative electrode active material respectively. The lithium secondary battery includes an electrode assembly including a positive electrode plate and a negative electrode plate coated with the positive electrode active material and the negative electrode active material respectively with a separator interposed between, and a packaging material, i.e., a battery case hermetically sealed, in which the electrode assembly is received together with an electrolyte solution.

In general, lithium secondary batteries may be classified into can type secondary batteries in which an electrode assembly is embedded in a metal can, and pouch type secondary batteries in which an electrode assembly is embedded in a pouch of an aluminum laminate sheet, according to the shape of the packaging material. These secondary batteries are generally manufactured by receiving the electrode assembly in the packaging material, injecting the electrolyte solution, and sealing the packaging material.

More recently, as the range of applications of pouch type secondary batteries expands, pouch type secondary batteries are widely used not only in small mobile devices such as smartphones, but also in medium- and large-scale devices such as electric vehicles including hybrid electric vehicles or power storage systems.

The secondary batteries may manifest different degrees of self-discharge for each secondary battery depending on environments in which the secondary batteries are manufactured or used. Additionally, in the case of a battery module including a plurality of secondary batteries, when a voltage deviation between the secondary batteries occurs due to self-discharge, the life and performance of the battery module may degrade. Accordingly, it is necessary to accurately predict a low voltage battery possibility according to the self-discharge degree of the secondary battery.

SUMMARY

Technical Problem

The present disclosure is designed under the background of the related art described above, and relates to an improved apparatus and method for testing a secondary battery that effectively determines a low voltage battery possibility of a secondary battery during self-discharge of the secondary battery.

These and other objects and advantages of the present disclosure will be understood by the following description and will be apparent from the embodiments of the present disclosure. Additionally, it will be readily understood that the objects and advantages of the present disclosure are realized by the means set forth in the appended claims and combinations thereof.

Technical Solution

To achieve the above-described object, an apparatus for testing a secondary battery according to an embodiment of the present disclosure includes a test path, a first test terminal provided at a first end of the test path, wherein the first test terminal is electrically connected to a positive terminal of the secondary battery, a second test terminal provided at a second end of the test path, wherein the second test terminal is electrically connected to a negative terminal of the secondary battery, one or more sensors provided on the test path and configured to measure a discharge current of the secondary battery, a voltage generator provided on the test path and configured to maintain a constant voltage between the secondary battery and the one or more sensors, and a control unit configured to receive data indicating the discharge current from the one or more sensors, measure an inflection point on a profile of the discharge current, measure an intensity of the discharge current based on the inflection point, and test a level of self-discharge of the secondary battery based on the intensity of the discharge current.

Additionally, the one or more sensors may be further configured to measure a voltage across the secondary battery.

Additionally, the control unit may be configured to receive the voltage across the secondary battery from the one or more sensors, and control a magnitude of the constant voltage of the voltage generator based on the voltage across the secondary battery.

Additionally, the control unit may be configured to maintain the magnitude of the constant voltage from a time point when the magnitude of the constant voltage is smaller than the voltage across the secondary battery until a time point when the magnitude of the constant voltage is equal to the voltage across the secondary battery.

Additionally, the control unit may be configured to determine a first inflection point on the profile. The first inflection point may occur when a magnitude of the voltage across the secondary battery and the magnitude of the constant voltage are equal.

Additionally, the control unit may be configured to map a cumulative capacity of the secondary battery with the measured discharge current of the secondary battery.

Additionally, the control unit may be configured to measure an intensity of the discharge current of the secondary battery based on a rate of change of the cumulative capacity of the secondary battery relative to the discharge current subsequent to the inflection point.

Additionally, the apparatus may be further configured for testing a plurality of secondary batteries. The first test terminal may be connected to a respective positive terminal of each one of the plurality of secondary batteries, and the second test terminal may be connected to a respective negative terminal of each one of the plurality of secondary batteries. The one or more sensors may be configured to measure the discharge current of each of the plurality of secondary batteries, and the control unit may be configured to determine a faulty battery among the plurality of secondary batteries based on a deviation in an intensity of the discharge current of the faulty battery compared to other of the plurality of secondary batteries.

Additionally, the control unit may be configured to measure a total amount of the discharge current based on the mapping of cumulative capacity of the secondary battery with the measured discharge current of the secondary battery.

Additionally, the apparatus for testing a secondary battery according to an embodiment of the present disclosure may further include a memory configured to store a reference value associated with the intensity of the discharge current.

Additionally, the control unit may be configured to receive the reference value associated with the intensity of the discharge current from the memory, and determine whether the secondary battery is faulty based on the reference value.

To achieve the above-described object, a method for testing a secondary battery according to an embodiment of the present disclosure includes maintaining a constant voltage across the secondary battery, measuring a discharge current of the secondary battery, measuring an inflection point on a profile of the discharge current, measuring an intensity of the discharge current based on the inflection point, and testing a level of self-discharge of the secondary battery based on the intensity of the discharge current.

Advantageous Effects

According to an aspect of the present disclosure, in a secondary battery, it is possible to predict a low voltage possibility of the secondary battery by using the intensity of self-discharge current of the secondary battery.

Particularly, according to an embodiment of the present disclosure, in the case of a battery module, an improved apparatus for testing a secondary battery is provided to accurately measure battery un-uniformity caused by a deviation in the intensity of self-discharge current by measuring the self-discharge current of each of a plurality of secondary batteries.

The present disclosure may have a variety of other effects, and these and other effects of the present disclosure will be understood by the following description and will be apparent from the embodiments of the present disclosure.

BRIEF DESCRIPTION OF DRAWINGS

The accompanying drawings illustrate preferred embodiments of the present disclosure, and together with the following detailed description of the present disclosure, serve to provide a further understanding of the technical aspects of the present disclosure, and thus, the present disclosure is not construed as being limited to the drawings.

DETAILED DESCRIPTION

Figure 1:
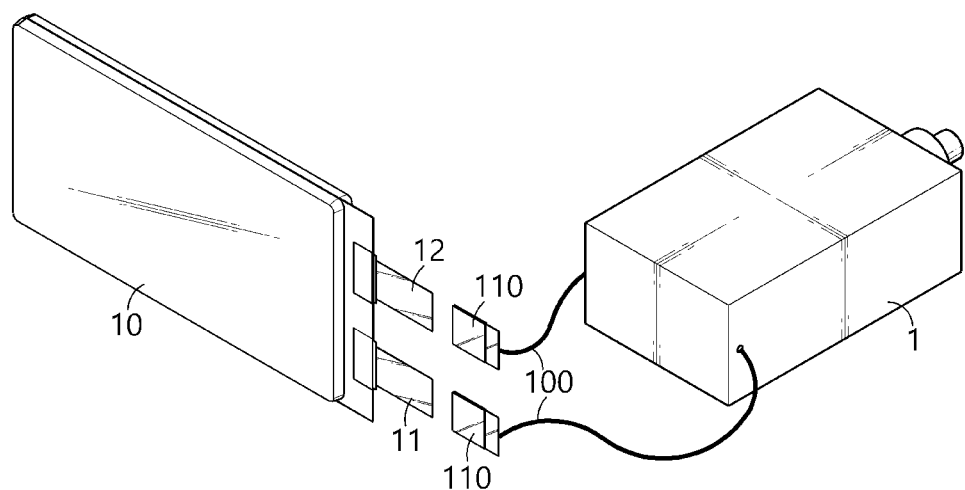
FIG. 1 is a schematic diagram showing an apparatus for testing a secondary battery according to an embodiment of the present disclosure, connected to the secondary battery.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'control unit' as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

In the specification, a secondary battery refers to a physically separable independent cell having a negative electrode terminal and a positive electrode terminal. For example, a pouch type lithium polymer cell may be regarded as a secondary battery.

An apparatus for testing a secondary battery according to the present disclosure is an apparatus that tests a secondary battery. For example, the apparatus for testing a secondary battery according to an embodiment of the present disclosure may test whether the secondary battery is faulty or not. Specifically, the apparatus for testing a secondary battery according to the present disclosure may test a low voltage battery possibility of the secondary battery. Additionally, the apparatus for testing a secondary battery according to an embodiment of the present disclosure may be connected to a battery module including a plurality of secondary batteries, and test a faulty battery among the plurality of secondary batteries. Here, the battery module may include a plurality of secondary batteries connected in series and/or in parallel.

Figure 2:
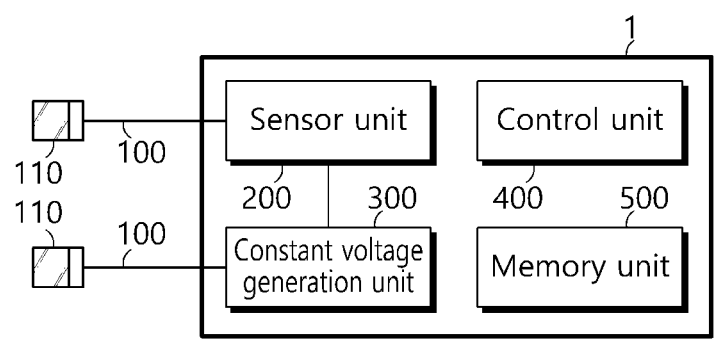
FIG. 2 is a schematic diagram showing a functional configuration of an apparatus for testing a secondary battery according to an embodiment of the present disclosure.

FIG. 1 is a schematic diagram showing an apparatus for testing a secondary battery according to an embodiment of the present disclosure, connected to the secondary battery, and FIG. 2 is a schematic diagram showing a functional configuration of the apparatus for testing a secondary battery according to an embodiment of the present disclosure.

Referring to FIGS. 1 and 2, the apparatus 1 for testing a secondary battery according to an embodiment of the present disclosure includes a test path 100, test terminals 110, a sensor unit 200, a constant voltage generation unit 300 and a control unit 400.

The test path 100 may be provided in the apparatus 1 for testing a secondary battery according to an embodiment of the present disclosure. For example, as shown in the configuration of FIGS. 1 and 2, the test path 100 may be provided inside or outside of the apparatus 1 for testing the secondary battery 10. For example, the test path 100 may be implemented as a conducting wire made of a conductive material to allow the current to flow.

The test terminals 110 may be provided at two ends of the test path 100 respectively. For example, as shown in the configuration of FIGS. 1 and 2, the test terminal 110 may be provided at each of the two ends of the test path 100. Additionally, the test terminals 110 may be electrically connected to each of a positive terminal 12 and a negative terminal 11 of the secondary battery 10 respectively. For example, the test terminals 110 may be implemented as a connector configured to have electrical contact with the terminal of the secondary battery 10 or the terminal of the battery module.

The sensor unit 200 may be provided on the test path 100. For example, as shown in the configuration of FIG. 2, the sensor unit 200 may be provided on the test path 100 and electrically connected to the two terminals of the secondary battery 10. Additionally, the sensor unit 200 may be configured to measure the discharge current of the secondary battery 10. For example, the sensor unit 200 may include a current sensor to measure the current flowing through the test path 100 using the current sensor.

The constant voltage generation unit 300 may be provided on the test path 100. For example, as shown in the configuration of FIG. 2, the constant voltage generation unit 300 may be provided on the test path 100 and electrically connected between the secondary battery 10 and the sensor unit 200. Additionally, the constant voltage generation unit 300 may be configured to maintain the constant voltage between the secondary battery 10 and the sensor unit 200. For example, the constant voltage generation unit 300 may be implemented as a voltage source that supplies the constant voltage. Additionally, the constant voltage generation unit 300 may generate and supply the constant voltage to maintain the constant voltage between the secondary battery 10 and the sensor unit 200.

The control unit 400 may receive data indicating the discharge current from the sensor unit 200. For example, the control unit 400 may be electrically connected to the sensor unit 200 to transmit and receive an electrical signal. Additionally, the control unit 400 may receive the measured data from the sensor unit 200.

Additionally, the control unit 400 may measure an inflection point on a profile of the discharge current. In more detail, the control unit 400 may measure the profile of the discharge current based on the data indicating the discharge current received from the sensor unit 200. Here, the profile of the discharge current indicates a change amount of the discharge current over time. Additionally, the control unit 400 may represent the profile of the discharge current in the form of a graph, and measure the inflection point on the profile of the discharge current. Here, the inflection point may be a point at which a change pattern of the discharge current over time changes.

Additionally, the control unit 400 may measure the intensity of the discharge current on the basis of the inflection point. For example, the intensity of the discharge current may indicate the magnitude of a cumulative capacity value per unit time. The cumulative capacity value will be described in detail below.

Additionally, the control unit 400 may be configured to test the level of self-discharge of the secondary battery 10 based on the intensity of the discharge current. Here, a secondary battery 10 having a high intensity of the discharge current may be a secondary battery 10 having a high level of self-discharge. In more detail, the control unit 400 may determine that the secondary battery 10 has a high level of self-discharge when the secondary battery 10 has a high intensity of the discharge current. Additionally, the control unit 400 may determine that the secondary battery 10 has a high possibility of low voltage (for example, a faulty battery) when the secondary battery 10 has the high level of self-discharge. For example, the control unit 400 may be implemented selectively including a processor, an Application-Specific Integrated Circuit (ASIC), a chipset, a logic circuit, a register, a communication modem and/or a data processing device, well known in the art to the perform the above-described operation.

Preferably, the sensor unit 200 may be further configured to measure the voltage across the secondary battery 10. In more detail, the sensor unit 200 according to an embodiment of the present disclosure may include a voltage measuring device electrically connected to the two terminals of the secondary battery 10 to measure the voltage across the two terminals of the secondary battery 10.

More preferably, the control unit 400 may be configured to receive the voltage across the secondary battery 10 from the sensor unit 200, and control the magnitude of the constant voltage generated by the constant voltage generation unit 300 based on the voltage across the secondary battery 10. In more detail, the control unit 400 may be electrically connected to the constant voltage generation unit 300 to transmit and receive an electrical signal. Additionally, the control unit 400 may control the operation of the constant voltage generation unit 300. For example, the control unit 400 may control the magnitude of the constant voltage generated by the constant voltage generation unit 300. Additionally, the control unit 400 may control the magnitude of the constant voltage of the constant voltage generation unit 300 such that the magnitude of the constant voltage of the constant voltage generation unit 300 is smaller than the magnitude of the voltage across the secondary battery 10 received from the sensor unit 200.

More preferably, the control unit 400 may control the constant voltage generation unit 300 to uniformly maintain the magnitude of the constant voltage. Additionally, the control unit 400 may uniformly maintain the magnitude of the constant voltage from a time point when the voltage across the secondary battery 10 is smaller than the magnitude of the constant voltage until a time point when the voltage across the secondary battery 10 is equal to the magnitude of the constant voltage.

Preferably, as shown in the configuration of FIG. 2, the apparatus 1 for testing a secondary battery according to an embodiment of the present disclosure may further include a memory unit 500.

The memory unit 500 may be electrically connected to the control unit 400 to transmit and receive an electrical signal. Additionally, the memory unit 500 is not limited to a particular type and includes any storage media capable of recording and erasing information. For example, the memory unit 500 may be, random-access memory (RAM), read-only memory (ROM), register, hard disk, an optical recording medium or a magnetic recording medium. Additionally, the memory unit 500 may be electrically connected to the control unit 400, for example, through a data bus, to allow the control unit 400 to access. Additionally, the memory unit 500 may store and/or update and/or erase and/or transmit programs including various types of control logics that are executed by the control unit 400, and/or data created when the control logics are executed.

More preferably, the control unit 400 may be configured to receive a reference value associated with the intensity of the discharge current from the memory unit 500, and determine whether the secondary battery 10 is faulty based on the received reference value.

For example, the memory unit 500 may store the reference value that is a criterion for determining a faulty battery, the control unit 400 may receive the reference value from the memory unit 500, and determine whether the secondary battery 10 is faulty based on the received reference value.

Figure 3:
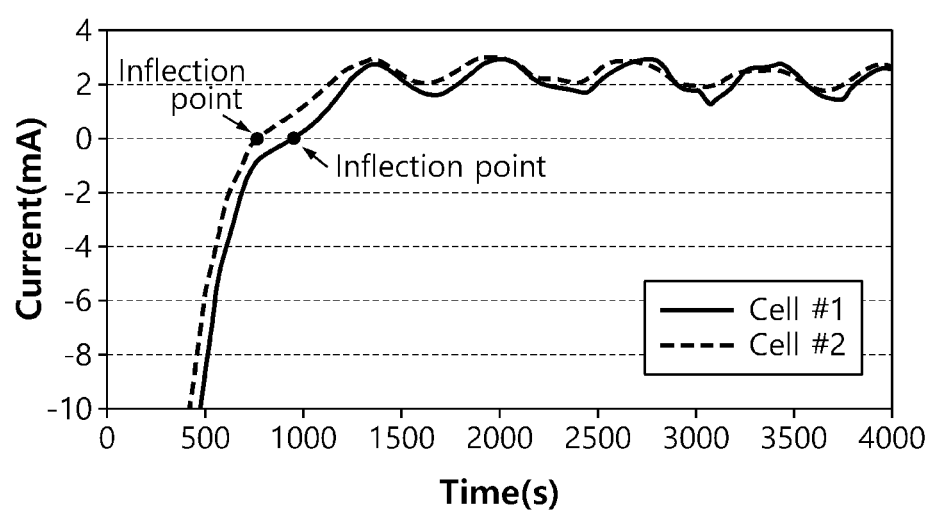
FIG. 3 shows a discharge current profile of a secondary battery referred by an apparatus for testing a secondary battery according to an embodiment of the present disclosure.

FIG. 3 shows the discharge current profile of the secondary battery referred by the apparatus for testing a secondary battery according to an embodiment of the present disclosure.

Referring to FIG. 3, the control unit 400 according to an embodiment of the present disclosure may plot a discharge current profile based on the data indicating the discharge current of the secondary battery over time. In more detail, the control unit 400 may measure a profile of the discharge current based on the data indicating the discharge current received from the sensor unit 200. Here, the profile of the discharge current indicates a change amount of the discharge current over time. Additionally, the control unit 400 may represent the profile of the discharge current in the form of a graph, and measure an inflection point on the profile of the discharge current. Here, the inflection point may be a point where a change pattern of the current over time changes.

Preferably, the control unit 400 may measure a first inflection point on the discharge current profile occurring when the magnitude of the voltage across the secondary battery and the magnitude of the constant voltage are equal. For example, in the graph of FIG. 3, a point where the magnitude of the discharge current is 0 may be a point where the magnitude of the voltage across the secondary battery and the magnitude of the constant voltage are equal. Here, the point where the magnitude of the discharge current is 0 may be the first inflection point.

For example, in the graph of FIG. 3, an area in which the magnitude of the discharge current is negative may be an area in which the magnitude of the constant voltage generated by the constant voltage generation unit 300 is smaller than the magnitude of the voltage across the secondary battery. Additionally, an area in which the magnitude of the discharge current is equal to or larger than 0 may be an area in which the magnitude of the constant voltage generated by the constant voltage generation unit 300 is equal to the magnitude of the voltage across the secondary battery.

Additionally, for example, as shown in FIG. 3, the apparatus for testing a secondary battery according to an embodiment of the present disclosure may measure a profile of discharge current for each of a plurality of secondary batteries. Additionally, the apparatus for testing a secondary battery may measure an inflection point for each of the plurality of secondary batteries.

Through this configuration, the apparatus for testing a secondary battery according to the present disclosure may measure a level of self-discharge of each secondary battery by measuring a self-discharge current intersection point (for example, an inflection point) on a self-discharge profile of each of the plurality of secondary batteries.

Figure 4:
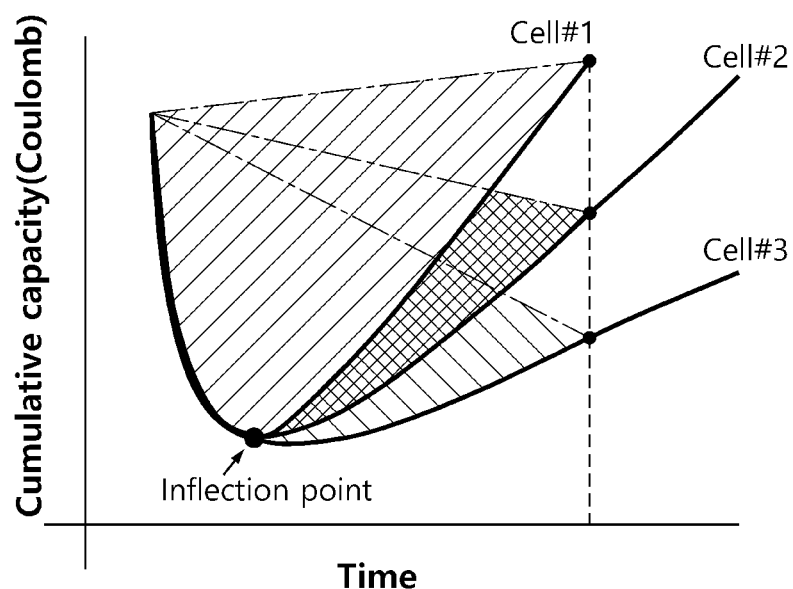
FIG. 4 shows a cumulative capacity graph of a secondary battery referred by an apparatus for testing a secondary battery according to an embodiment of the present disclosure.

FIG. 4 shows a cumulative capacity graph of a secondary battery referred by an apparatus for testing a secondary battery according to an embodiment of the present disclosure.

Referring to FIG. 4, the control unit 400 according to an embodiment of the present disclosure may plot a cumulative capacity graph in the unit of coulomb-time based on the data indicating the discharge current of the secondary battery 10. Here, the cumulative capacity graph indicates a change amount of cumulative capacity value over time.

Additionally, the control unit 400 may measure an inflection point on the cumulative capacity graph based on the inflection point on the profile of the discharge current. Additionally, the control unit 400 may measure the intensity of the discharge current on the basis of the inflection point.

In more detail, in the graph of FIG. 4, the control unit 400 may measure the intensity of the discharge current using a slope of the graph subsequent to the inflection point on the cumulative capacity graph. Here, the slope of the cumulative capacity graph indicates a change amount of cumulative capacity value per unit time. For example, in the graph of FIG. 4, the graph subsequent to the inflection point on the cumulative capacity graph of Cell #1, Cell #2 and Cell #3 have a higher slope in the order of Cell #1>Cell #2>Cell #3. That is, the intensity of the discharge current of Cell #1, Cell #2 and Cell #3 is higher in the order of Cell #1>Cell #2>Cell #3.

Additionally, preferably, the control unit 400 may be configured to measure the total amount of the discharge current using the cumulative capacity value on the cumulative capacity graph. In more detail, the control unit 400 may measure the total amount of the discharge current based on the area of the cumulative capacity graph. For example, in the graph of FIG. 4, the hatched area of each graph indicates the total amount of the self-discharge current for the unit time of each secondary battery. The area of the graph of Cell #1, Cell #2 and Cell #3 is wider in the order of Cell #1>Cell #2>Cell #3. That is, the intensity of the discharge current of Cell #1, Cell #2 and Cell #3 has a larger total amount of the discharge current in the order of Cell #1>Cell #2>Cell #3.

More preferably, the apparatus for testing a secondary battery according to an embodiment of the present disclosure may test a plurality of secondary batteries. In more detail, the test terminals may be configured to be connected to each of two terminals of the plurality of secondary batteries. Additionally, the sensor unit 200 may measure the discharge current of each of the plurality of secondary batteries. Additionally, the control unit 400 may be configured to determine a faulty battery among the plurality of secondary batteries based on a deviation in the intensity of the discharge current between each secondary battery. In more detail, when the deviation in the intensity of the discharge current between the plurality of secondary batteries occurs, the life and performance of the battery module may be degraded by non-uniformity. Accordingly, the apparatus for testing a secondary battery according to an embodiment of the present disclosure may determine a faulty battery by measuring the deviation in the intensity of the discharge current.

Figure 5:
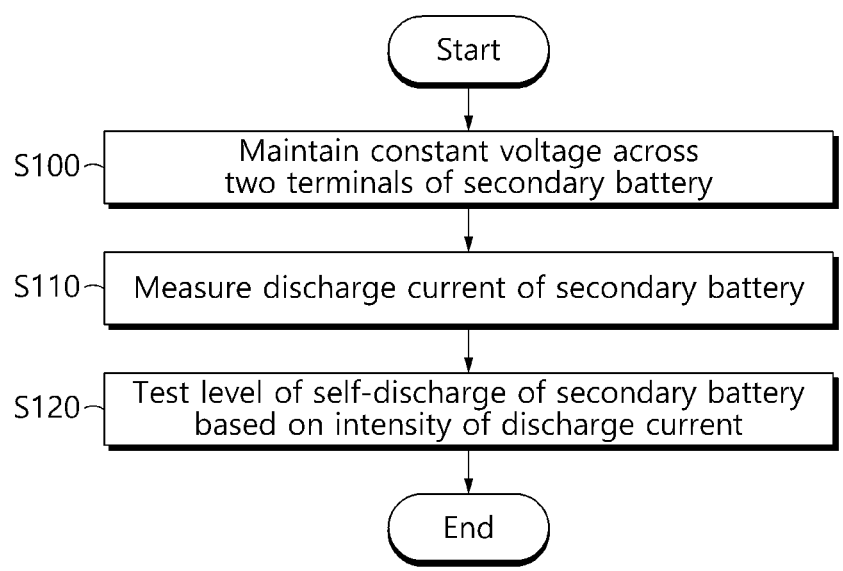
FIG. 5 is a schematic flowchart showing a method for testing a secondary battery according to an embodiment of the present disclosure.

FIG. 5 is a schematic flowchart showing a method for testing a secondary battery according to an embodiment of the present disclosure. In FIG. 5, the subject that performs each step may be each component of the apparatus for testing a secondary battery according to the present disclosure as described previously.

As shown in FIG. 5, in the constant voltage maintenance step S100, the constant voltage generation unit 300 may maintain the constant voltage across the secondary battery 10.

Subsequently, in the discharge current measurement step S110, the sensor unit 200 may measure the discharge current of the secondary battery 10.

Subsequently, in the test step S120, the control unit 400 may measure an inflection point on a profile of the discharge current, measure the intensity of the discharge current on the basis of the inflection point, and test the level of self-discharge of the secondary battery 10 based on the intensity of the discharge current.

Preferably, in the constant voltage maintenance step S100, the sensor unit 200 may measure the voltage across the secondary battery 10. Additionally, the control unit 400 may receive the voltage across the two terminals of the secondary battery 10 from the sensor unit 200, and control the magnitude of the constant voltage of the constant voltage generation unit 300 based on the voltage across the two terminals of the secondary battery 10.

More preferably, in the constant voltage maintenance step S100, the control unit 400 may uniformly maintain the magnitude of the constant voltage from a time point when the magnitude of the constant voltage is smaller than the voltage across the secondary battery 10 until a time point when the magnitude of the constant voltage is equal to the voltage across the secondary battery 10.

Additionally, preferably, in the discharge current measurement step S110, the sensor unit 200 may measure the discharge current of each of a plurality of secondary batteries.

Additionally, preferably, in the test step S120, the control unit 400 may measure a first inflection point on the profile occurring when the magnitude of the voltage across the two terminals of the secondary battery 10 and the magnitude of the constant voltage are equal. Additionally, the control unit 400 may plot a cumulative capacity graph by the unit of coulomb-time based on data indicating the discharge current. Additionally, the control unit 400 may measure the intensity of the discharge current using a slope of the graph subsequent to the inflection point on the cumulative capacity graph. Additionally, the control unit 400 may measure the total amount of the discharge current using the cumulative capacity value on the cumulative capacity graph. Additionally, the control unit 400 determine a faulty battery among the plurality of secondary batteries based on a deviation in the intensity of the discharge current between each secondary battery.

Additionally, when the control logic is implemented in software, the control unit may be implemented as a set of program modules. In this instance, the program module may be stored in the memory device and executed by the processor.

Additionally, there is no particular limitation on the type of control logics of the control unit if at least one of control logics may be combined and the combined control logics may be written in computer-readable coding system to allow the computer to access and read. For example, the recording media includes at least one selected from the group consisting of ROM, RAM, register, CD-ROM, magnetic tape, hard disk, floppy disk and an optical data recording device. Additionally, the coding system may be stored and executed in computers connected via a network in distributed manner Additionally, functional programs, codes and code segments for implementing the combined control logics may be readily inferred by programmers in the technical field to which the present disclosure belongs.

While the present disclosure has been hereinabove described with regard to a limited number of embodiments and drawings, the present disclosure is not limited thereto and various modifications and changes may be made by those skilled in the art within the technical aspects of the present disclosure and the equivalent scope of the appended claims.

Although the term 'unit' such as 'memory unit' and 'control unit' is used herein, it refers to a logical component unit, and it is obvious to those skilled in the art that the term does not necessarily indicate a component that may or should be physically separated.

What is claimed is:

1. An apparatus for testing a secondary battery, comprising:
   a test path;
   a first test terminal provided at a first end of the test path, wherein the first test terminal is are electrically connected to a positive terminal of the secondary battery;
   a second test terminal provided at a second end of the test path, wherein the second test terminal is electrically connected to a negative terminal of the secondary battery;
   one or more sensors provided on the test path, wherein the sensor is configured to measure a discharge current of the secondary battery;
   a voltage generator provided on the test path, wherein the voltage generator is configured to maintain a constant voltage between the secondary battery and the one or more sensors; and
   a control unit configured to:
      receive data indicating the discharge current from the one or more sensors;
      measure an inflection point on a profile of the discharge current;
      measure an intensity of the discharge current based on the inflection point; and
      test a level of self-discharge of the secondary battery based on the intensity of the discharge current.

2. The apparatus according to claim 1, wherein the one or more sensors are further configured to measure a voltage across the secondary battery.

3. The apparatus according to claim 2, wherein the control unit is configured to:
   receive the voltage across the secondary battery from the one or more sensors; and
   control a magnitude of the constant voltage of the voltage generator based on the voltage across the secondary battery.

4. The apparatus according to claim 3, wherein the control unit is configured to maintain the magnitude of the constant voltage from a time point when the magnitude of the constant voltage is smaller than the voltage across the secondary battery until a time point when the magnitude of the constant voltage is equal to the voltage across the secondary battery.

5. The apparatus according to claim 4, wherein the control unit is configured to determine a first inflection point on the profile, wherein the first inflection point occurs when a magnitude of the voltage across the secondary battery and the magnitude of the constant voltage are equal.

6. The apparatus according to claim 5, wherein the control unit is configured to map a cumulative capacity of the secondary battery with the measured discharge current of the secondary battery.

7. The apparatus according to claim 6, wherein the control unit is configured to measure an intensity of the discharge current of the secondary battery based on a rate of change of the cumulative capacity of the secondary battery relative to the discharge current subsequent to the inflection point.

8. The apparatus according to claim 7, wherein the apparatus is further configured for testing a plurality of secondary batteries,
wherein the first test terminal is connected to a respective positive terminal of each one of the plurality of secondary batteries,
wherein the second test terminal is connected to a respective negative terminal of each one of the plurality of secondary batteries;
wherein the one or more sensors are configured to measure a discharge current of each of the plurality of secondary batteries; and
wherein the control unit is configured to determine a faulty battery among the plurality of secondary batteries based on a deviation in an intensity of the discharge current of the faulty battery compared to other of the plurality of secondary batteries.

9. The apparatus according to claim 6, wherein the control unit is configured to measure a total amount of the discharge current based on the mapping of cumulative capacity of the secondary battery with the measured discharge current of the secondary battery.

10. The apparatus for testing a secondary battery according to claim 1, further comprising:
a memory configured to store a reference value associated with the intensity of the discharge current.

11. The apparatus according to claim 10, wherein the control unit is configured to:
receive the reference value associated with the intensity of the discharge current from the memory, and
determine whether the secondary battery is faulty based on the reference value.

12. A method for testing a secondary battery, comprising:
maintaining a constant voltage across the secondary battery;
measuring a discharge current of the secondary battery;
measuring an inflection point on a profile of the discharge current;
measuring an intensity of the discharge current based on the inflection point; and
testing a level of self-discharge of the secondary battery based on the intensity of the discharge current.

* * * * *